United States Patent [19]
Sakamoto et al.

[11] Patent Number: 5,327,643
[45] Date of Patent: Jul. 12, 1994

[54] METHOD OF AND APPARATUS FOR WIRING BOARD ASSEMBLIES

[75] Inventors: Masami Sakamoto; Eiji Shimochi; Hisashi Sato; Hiroyuki Murakoshi; Hirokazu Tsuchiya, all of Shizuoka, Japan

[73] Assignee: Yazaki Corporation, Tokyo, Japan

[21] Appl. No.: 93,623

[22] Filed: Jul. 20, 1993

[30] Foreign Application Priority Data

Jul. 28, 1992 [JP] Japan ................................. 4-201149
Apr. 16, 1993 [JP] Japan ................................. 5-089876

[51] Int. Cl.$^5$ .......................... H05K 3/36; B23P 19/00
[52] U.S. Cl. .......................... 29/830; 29/425; 29/755; 179/72 A
[58] Field of Search .................. 29/850, 425, 423, 755, 29/830; 174/117 F, 72 A

[56] References Cited

U.S. PATENT DOCUMENTS 4,065,199 12/1977 Andre et al. .................. 174/72 A X
4,255,853 3/1981 Coumpillo et al. ................ 29/850 X

*Primary Examiner*—Carl J. Arbes
*Attorney, Agent, or Firm*—Armstrong, Westerman, Hattori, McLeland & Naughton

[57] ABSTRACT

The present invention provides a wiring method and apparatus to wire two wiring board assemblies, each of which comprises: an insulating substrate; and a plurality of pressure terminals or busbars secured to the substrate, each having a press-connection portion formed with a slot. Wire connection is made by pressing the wires into the slots of the pressure terminals. The process of wiring is as follows. With two or more pairs of front and rear wire laying heads arranged on a wire laying plate that holds the insulating substrate, (a) a plurality of wires are parallelly laid between the two wiring board assemblies; (b) each wire is supported at two points of an intermediate portion of the wire to keep both end portions of each wire straight; (c) the wire laying heads are moved in a direction perpendicular to the wire laying direction and the first row wire is positioned on specified slots of the pressure terminals on the two wiring board assemblies; (d) the first row wire is pressed into the slots and cut; (e) the steps (c) and (d) are repeated to press the second to final row wires into specified slots of the pressure terminals on the two wiring board assemblies and cut these wires; and (f) the steps (a) to (e) are repeated.

4 Claims, 16 Drawing Sheets

STEP 1

STEP 2

STEP 3

STEP 6

STEP 7

STEP 8

METHOD OF AND APPARATUS FOR WIRING BOARD ASSEMBLIES

BACKGROUND OF THE INVENTION

1. Field of the Invention

The present invention relates to a method of and apparatus for wiring one or two wiring board assemblies in an electric junction boxes used for interconnecting wiring harness.

2. Description of the Prior Art

FIG. 33 is an exploded perspective view of a conventional electric junction box, showing its internal circuit composed of a busbar wiring board, wires and pressure terminals.

Designated i is an upper case made of synthetic resin, 2 a lower case, and 3 an insulating substrate on which a plurality of busbars 4 are arranged. Each busbar 4 is formed with branched tabs 4a, 4b, 4c, which are pressed into a tab insertion holes 5, 5' in the upper and lower cases 1, 2 and led into fuse cavities 6 and a framed housing 6' indicated by a dashed line. Denoted 7 is a female-female junction terminal used to interconnect the tab 4b and fuse 8. Pressure terminals 9 and 9' are of the same construction and have a male terminal portion 9a at one end and, at the other end, a wire receiving slot 9b, these terminals being pressed into the tab insertion holes 5, 5'.

The tabs 4b of the busbars 4 are connected to the upstream side of the fuse 8 while the pressure terminals 9 are connected to the downstream side of the fuse 8. A plurality of wires $10_1, 10_2, 10_3, \ldots$ are pressed at one end into the slot 9b of each pressure terminal 9 and at the other end connected to one or more pressure terminals 9'.

Since the above electric junction box has the circuit upstream of the fuse 8 arranged on a busbar wiring board a and the downstream circuit formed of pressure terminals 9, 9' and wires 10 ($10_1, 10_2, \ldots$), addition or deletion of option circuits and changes in circuit can be dealt with easily and swiftly without changing the busbar pattern by increasing the number of pressure terminals 9' downstream or changing their positions, allowing this electric junction box to be used for a wide range of applications regardless of the kind and class of automobiles.

In the manufacture of a wiring board assembly in a conventional electric junction box, because the work for wiring between the pressure terminals 9 and 9' is carried out manually, this work not only takes time but also has a problem of human errors, such as using wrong sizes of wire and wrong pressure-connecting positions.

SUMMARY OF THE INVENTION

The present invention has been accomplished in light of the above drawback and aims to provide a wiring method and device which enables quick and accurate wiring and connection of the wiring board assembly which forms an internal circuit of an electric junction box.

Another object of this invention is to provide a wiring method and device which permits a higher density of wiring by widening the range of wiring that can be performed.

To achieve the above objective, the wiring method according to this invention has the following steps as a first aspect of the invention in a method of wiring one or two wiring board assemblies, each of which comprises a plurality of pressure terminals or busbars, each having a press-connection portion formed with a slot, and an insulating substrate that supports the pressure terminals or busbars; the method of wiring the wiring board assemblies by pressing wires into the slots of the press-connection portions on the wiring board assemblies to form a desired circuitry, comprises the steps of:

(a) laying a plurality of wires in parallel to each other between one side of the insulating substrate of the wiring board assembly and the other side or between two wiring board assemblies by operating two or more pairs of front and rear wire laying heads arranged in two parallel lines in a direction perpendicular to the wire laying direction;

(b) supporting an intermediate portion of each wire at two points at an appropriate interval to hold the wires outside the supported intermediate portions straight;

(c) moving the wire laying heads in a direction perpendicular to the wire laying direction to position the first row wire on the slots of specified press-connection portions on both sides of the wiring board assembly or on the slots of specified press-connection portions on two wiring board assemblies;

(d) pressing the positioned first row wire into the slots and cutting the wire;

(e) repeating the steps (c) and (d) to press the second to final row wires into the slots of specified press-connection portions on both sides of one wiring board assembly or into slots of specified press-connection portions on two wiring board assemblies and cutting the wires; and (f) repeating the steps (a) to (e) for the remaining press-connection portions on the wiring board assemblies.

The wiring apparatus to implement the above wiring method is comprised as follows: a wiring apparatus for wiring board assemblies comprises:

a wire laying plate on which the wiring board assemblies are mounted; and a plurality of wire laying heads arranged in parallel with each other on the wire laying plate, each wire laying head comprising a pair of front and rear heads that move vertically and parallelly with respect to the wire laying plate;

the front head including, from the front toward the rear, a wire chuck that can be opened and closed, a pressing jig and wire guide pins;

the rear head including, from the front toward the rear, wire guide pins, a pressing jig and a wire cutter, the rear head further including:

a wire holding rod located below the members of the rear head, the wire holding rod moving toward or away from the wire chuck of the front head, the wire holding rod having a wire insertion hole and a wire chuck.

A further aspect of this invention is summarized below: in a method of wiring one or two wiring board assemblies, each of which comprises a plurality of pressure terminals or busbars, each having a press-connection portion formed with a slot, and an insulating substrate that supports the pressure terminals or busbars; the method of wiring the wiring board assemblies by pressing wires into the slots of the press-connection portions on the wiring board assemblies to form a desired circuitry, comprises the steps of:

(a') laying a plurality of wires in parallel to each other between one side of the insulating substrate of the wiring board assembly and the other side by operating two or more pairs of front and rear wire laying heads arranged in two parallel lines in a direction perpendicular to the wire laying direction;

(b') supporting an intermediate portion of each wire at two points at an appropriate interval to hold the wires outside the supported intermediate portions straight;

(c') moving the wire laying heads in a direction perpendicular to the wire laying direction to position the first row wire on the slots of specified press-connection portions on both sides of the wiring board assembly;

(d') pressing the positioned first row wire into the slots and cutting the wire;

(e') repeating the steps (c) and (d) to press the second to final row wires into the slots of specified press-connection portions on both sides of one wiring board assembly and cutting the wires;

(f') rotating the insulating substrate in the same plane of the substrate and repeating the steps (a') to (e') to perform wire laying and press-connection work in a direction crossing the already laid wires; and (g) repeating the steps (a') to (e') and step (f') selectively for the remaining press-connection portions on the wiring board assembly.

The apparatus to implement the above process includes a means to rotate the wire laying plate in the same plane as the plate surface, in addition to the wire laying plate and the plurality of wire laying heads.

With the present invention of the first aspect of the invention, discussed above on pages 3-5, since the conventional manual wiring work is eliminated by the use of the front and rear heads which are operated to lay the wires in the single wiring board assembly or between two wiring board assemblies and to make press-connection of the wires, troubles such as erroneous wiring or using wrong wire sizes can be eliminated. Laying the wires and pressing the wires into the slots of the press-connection portions are performed beginning with the first row wire on the outermost side and then with the second row wire and ending with the final row wire in that order, by operating the parallelly arranged wire laying heads. This procedure makes the distance of travel of the wire laying heads shortest, and thus the wiring work can be done in a short period of time. Further, since the front head and the rear head each have wire guide pins to support the intermediate portion of each laid wire at two points, the both end portions of the wires are kept ordered, that is, kept straight while allowing the intermediate portions of the wires to be laid crossing each other between the sides of one wiring board assembly or between two wiring board assemblies.

Furthermore, with this invention of the further aspect of the invention, discussed above on pages 5-7, since the apparatus is provided with a means to rotate the wire laying plate in the same plane as the plate surface, it is possible to perform the wire laying and the press-connection in two orthogonal directions, thus increasing the range of wiring and improving the wiring density.

DETAILED DESCRIPTION OF PREFERRED EMBODIMENT

Figure 1:
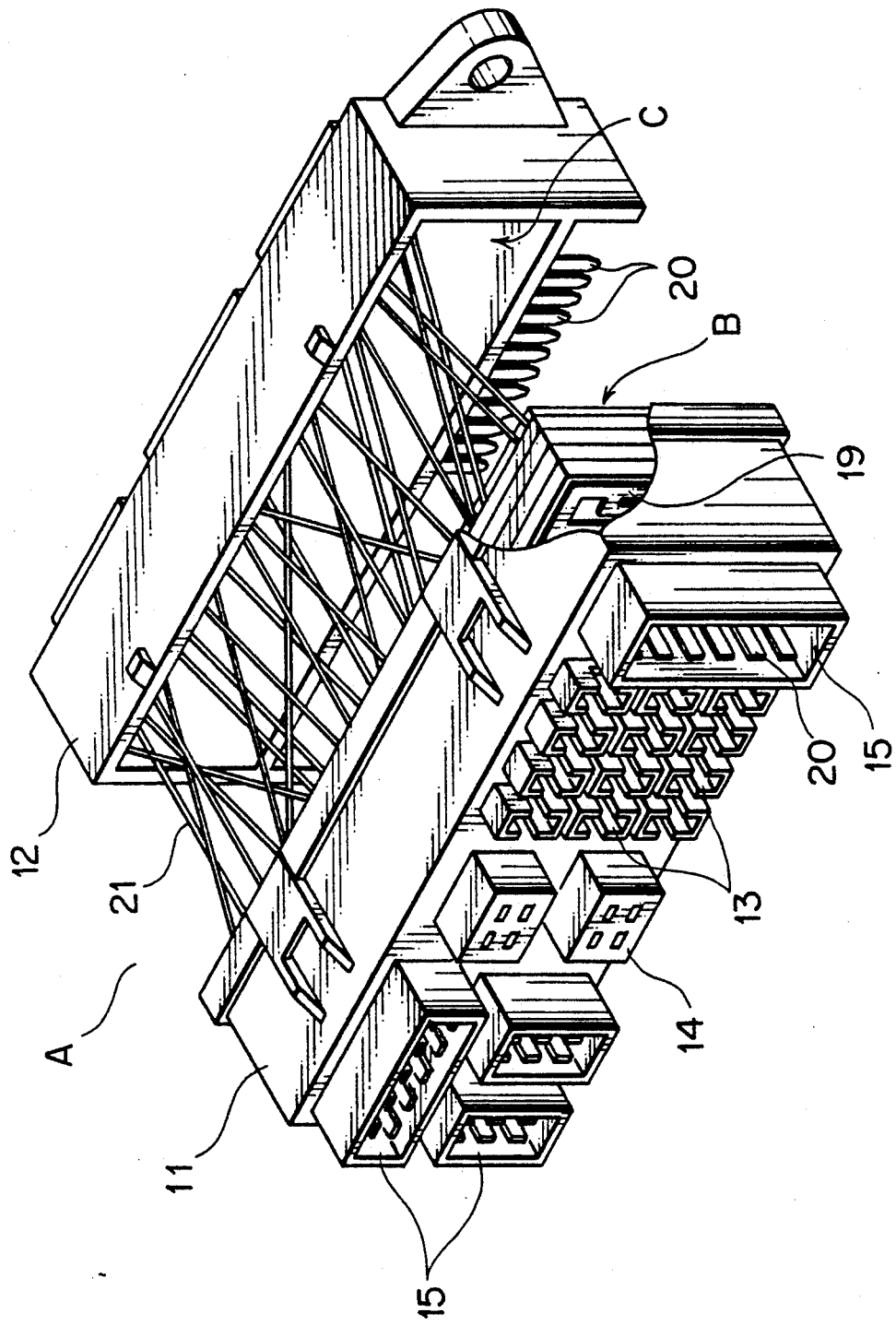
FIG. 1 is a perspective view showing an example of the electric junction box wired according to this invention.
Figure 2:
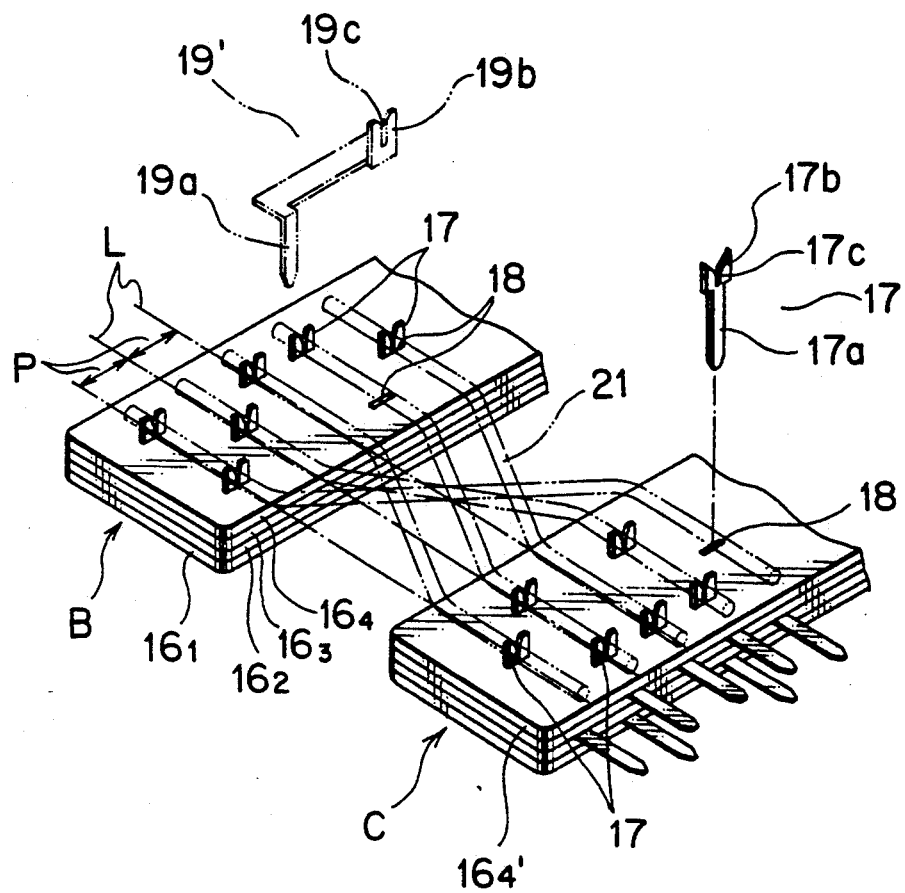
FIG. 2 is a perspective view showing the method of wiring between two wiring board assemblies in FIG. 1.

FIG. 1 is an exploded perspective view of an electric junction box A according to the present invention. FIG. 2 is a perspective view showing the method of wiring between wiring board assemblies B and C that constitute the internal circuit of the electric junction box.

The electric junction box A includes a pair of upper case 11 and lower case 12 and wiring board assemblies B, C which are installed in the upper and lower cases respectively and are interconnected by a plurality of wires 21. Denoted 13 are fuse cavities, 14 relay mounting portions, and 15 a receiver connector for a terminal connector (not shown) of wiring harness.

The wiring board assemblies B, C, as shown in FIG. 2, is made up a plurality of insulating substrates $16_1$, $16_2$, . . . (representatively indicated simply by 16) stacked one upon the other, with the uppermost substrate $16_4$, $16_4'$ attached with a plurality of pressure terminals 17. The pressure terminal 17, as with the conventional one, has a male terminal portion 17a at one end and, at the other end, a pressure-contact portion 17b formed with a slot 17c. The insulating substrates 16 in each layer are formed with a plurality of insertion holes 18 for the pressure terminals 17, which are positioned at predetermined intervals on virtual imaginary lines L that are spaced at certain pitches P or positioned at intersections in an imaginary grate. The third and lower insulating substrates $16_3$, $16_2$, $16_1$, as in the conventional junction box, are provided with busbars 19, whose tabs 20 are led out, along with the terminal portions 17a of the pressure terminals 17, into the fuse cavities 13, relay insertion portions 14 and a receiver connector 15.

Depending on the circuit configuration, some of the pressure terminals 17 may be replaced with busbars 19' that have a branch connection tab 19a and a pressure-contact portion 19b with a slot 19c, as illustrated by an imaginary line.

As shown by imaginary lines in FIG. 2, wires 21 are pressed into the slots 17c of the pressure terminals 17 of the two wiring board assemblies B, C to form a desired circuit.

Figure 3:
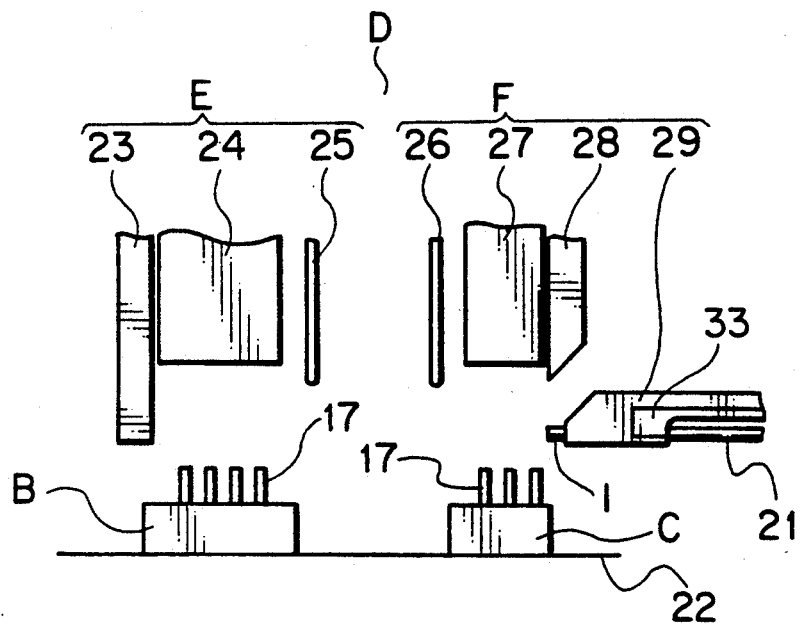
FIG. 3 is a side view showing essential portions of a wiring apparatus as one embodiment of this invention.
Figure 4:
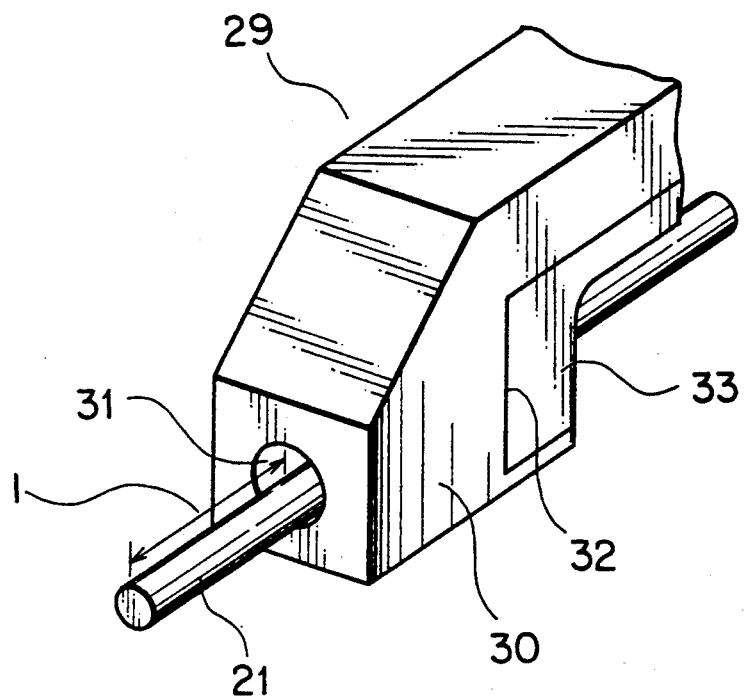
FIG. 4 is a perspective view of a wire chuck portion of FIG. 3.
Figure 5:
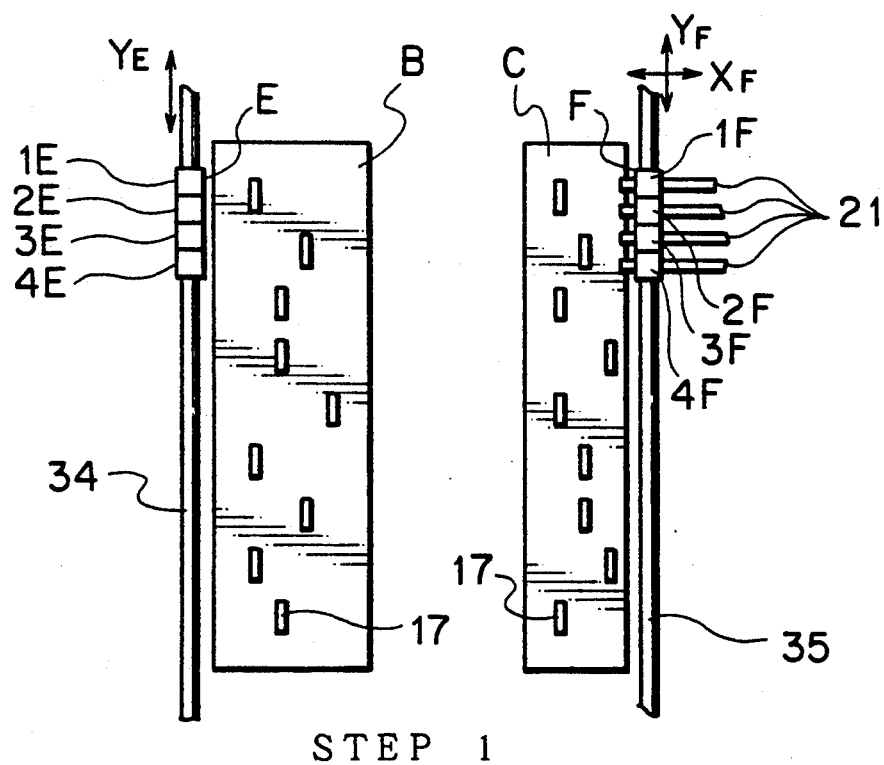
FIG. 5 is a plan view showing the first step of the wiring process as performed by the apparatus of FIG. 3.
Figure 6:
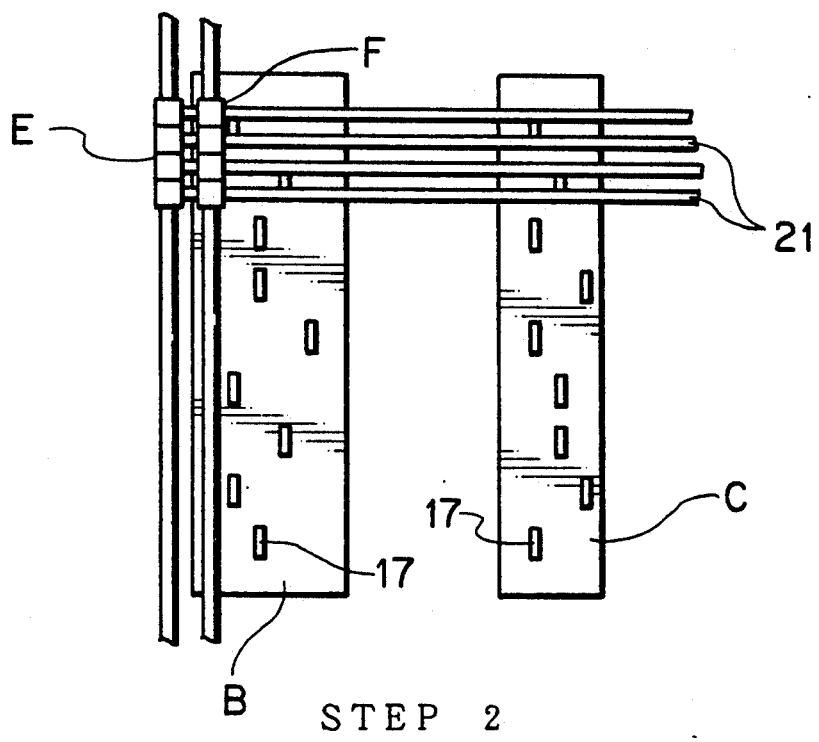
FIG. 6 is a plan view showing the next step in FIG. 5.
Figure 7:
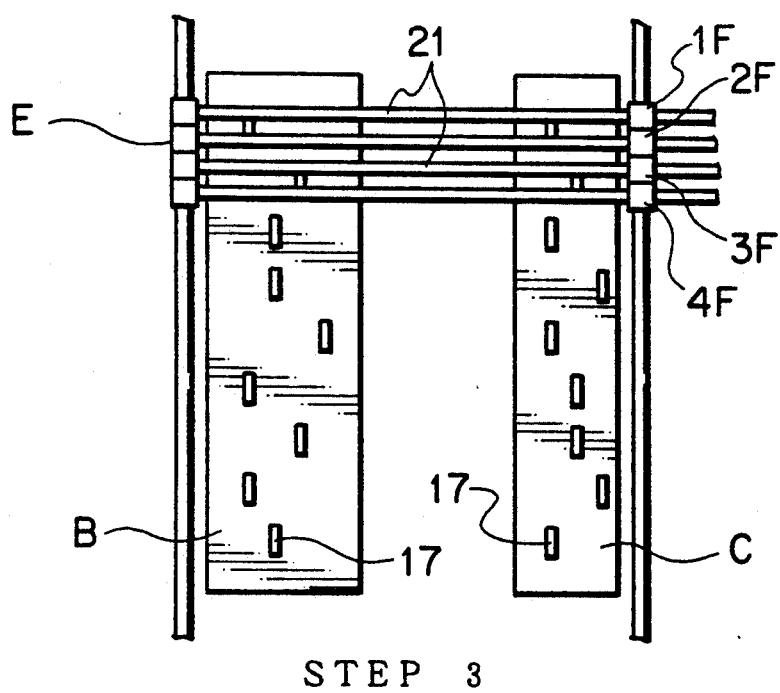
FIG. 7 is a plan view showing the next step in FIG. 6.
Figure 8:
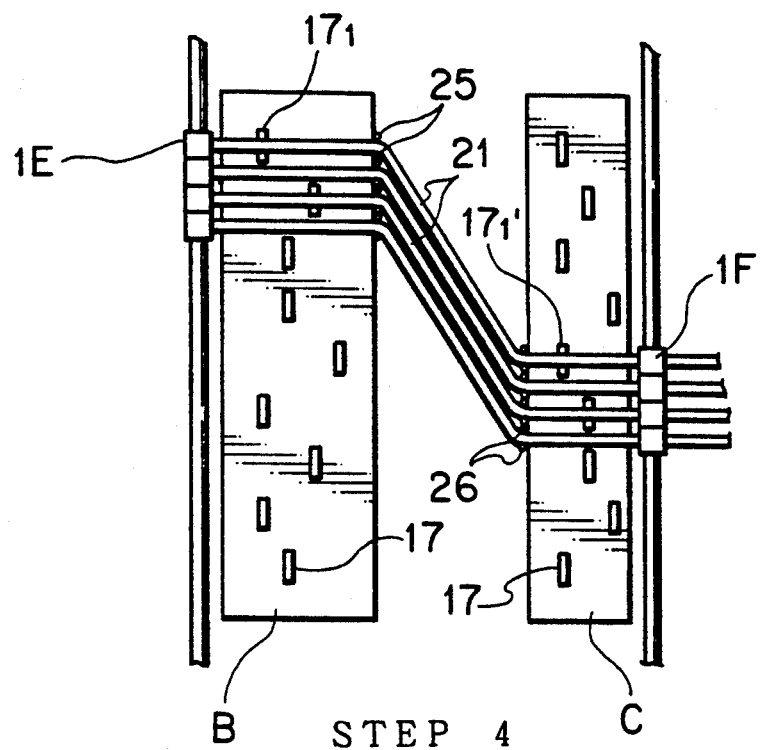
FIG. 8 is a plan view showing the next step in FIG. 7.
Figure 9:
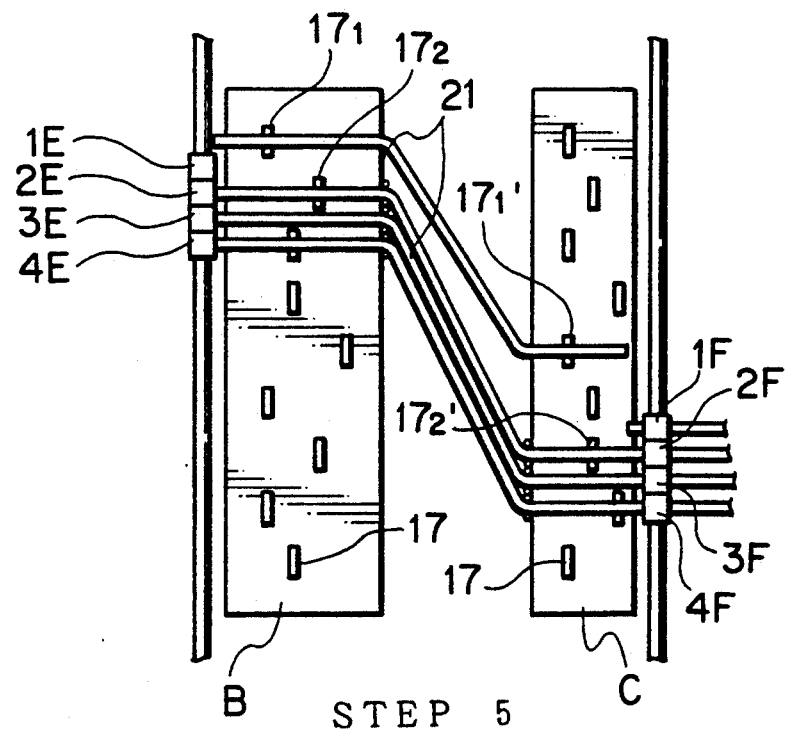
FIG. 9 is a plan view showing the next step in FIG. 8.
Figure 10:
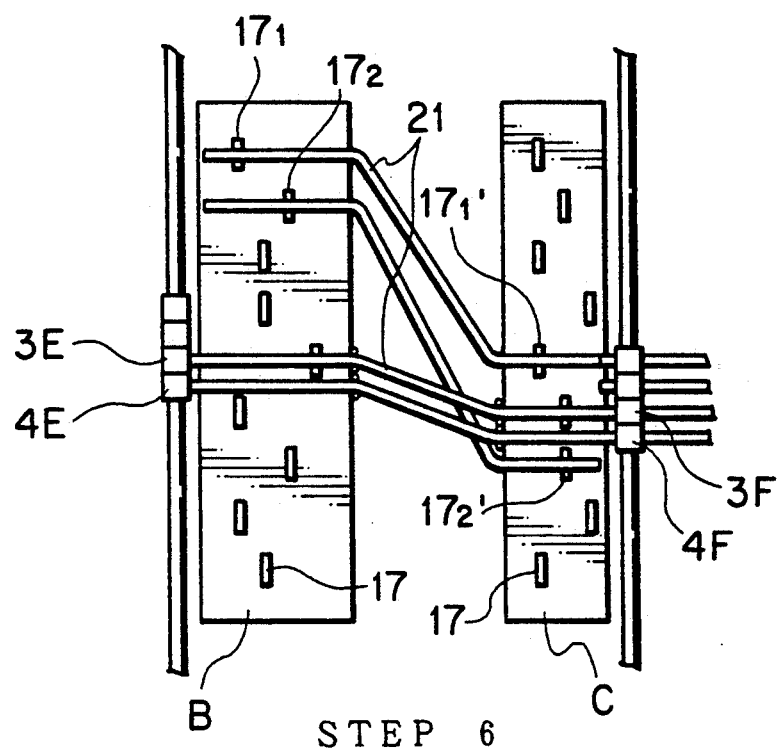
FIG. 10 is a plan view showing the next step in FIG. 9.
Figure 11:
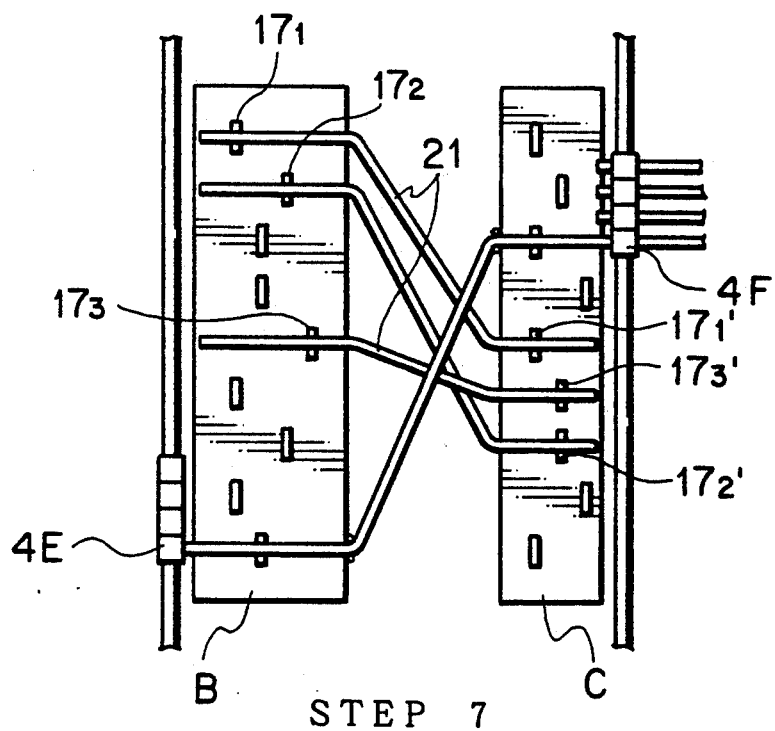
FIG. 11 is a plan view showing the next step in FIG. 10.
Figure 12:
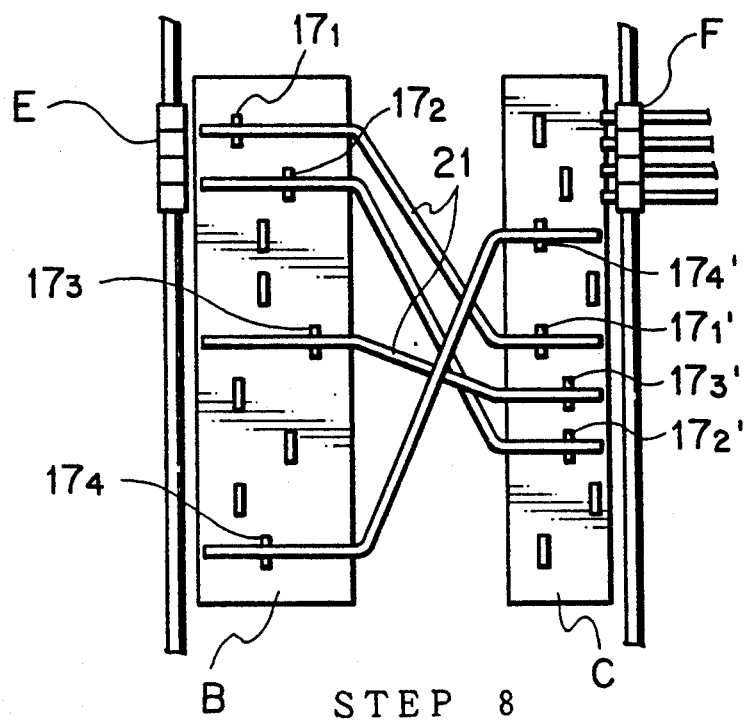
FIG. 12 is a plan view showing the next step in FIG. 11.

FIG. 3 shows a side view of a wiring apparatus, FIG. 4 an enlarged perspective view of a wire chuck portion, and FIG. 5 a plan view showing the first process of wiring as performed by the apparatus of FIG. 3.

In FIG. 3, designated D is the wiring apparatus equipped with a wire laying plate 22, on which are arranged two wiring board assemblies B, C spaced an appropriate distance apart. Mounted over the wire laying plate 22 is a wire laying head consisting of a pair of front head E and rear head F.

As shown in FIG. 2, each wiring board assembly B, C has a large number of pressure terminals 17 secured thereto and arranged in multiple parallel rows with the slots 17c projecting above the upper surface of the wiring board assembly. The wire laying heads E, F can be moved vertically and parallelly (X-Y axis direction) with respect to the wire laying plate 22.

The front head E includes, from left to right in FIG. 3, a wire chuck 23 that can be opened and closed, a plate-like pressing jig 24 and a pair of wire guide pins 25, and has these three members arranged in a row as one group with each member being able to be moved up or down independently.

The rear head F includes, from left to right, a pair of wire guide pins 26, a pressing jig 27, a wire cutter 28, all these members arranged in a line, and a wire holding rod 29 which is located below the three members and retractable with respect to the wire chuck 23. The wire holding rod 29, as shown in FIG. 4, has a wire insertion hole 31 formed in a head portion 30 and a recess 32 formed at the back of the head portion 30, in which a wire chuck 33 is installed.

As shown in FIG. 5, there are four wire laying head units (four each for the front head E and the rear head F) arranged in a line and designated, from top to bottom in the figure, 1E, 2E, 3E, 4E and 1F, 2F, 3F, 4F. The front heads 1E-4E and the rear heads 1F-4F are integrally mounted on a first frame 34 and a second frame 35, respectively. In the figure, an axis $Y_E$ represents the direction in which the front heads 1E-4E move, and axes $X_F$-$Y_F$ represent the directions in which the rear heads 1F-4F move.

By referring to FIG. 5 to FIG. 12 and FIG. 13 to FIG. 18, the process of wiring and pressure-connecting between the two wiring board assemblies B, C will be described.

Step 1 (FIGS. 5, 13) represents an initial state, in which the front heads 1E-4E are located on the outside of the wiring board assembly B (at the left side in the figure) and the rear heads 1F-4F are located on the outside of the wiring board assembly C (at the right side in the figure). Four wires 21 are held by the wire chucks 33 of the wire holding rods 29 of the rear heads 1F-4F, with the front ends of the wires projecting a specified length from the heads 30 (see FIG. 4).

In step 2 (FIGS. 6, 14), the wire holding rods 29 of the rear heads 1F-4F move in the direction of $X_F$ axis (to the left) to cause the front ends 1 of the wires 21 projecting from the heads 30 to be clamped by the wire chucks 23 of the front heads 1E-4E.

At step 3 (FIGS. 7, 15), the wire chucks 33 of the rear heads 1F-4F are opened and the wire holding rods 29 return to their original positions. Now, the four wires 21 are held in parallel between the wiring board assemblies B and C.

At step 4 (FIGS. 8, 16-18), the pressing jig 24, the pair of wire guide pins 25, the pair of wire guide pins 26 and the pressing jig 27 are lowered onto the wire 21 to support the both ends of an intermediate portion of the wire 21 in the first row by the wire guide pins 25, 26, after which the front heads 1E-4E and the rear heads 1F-4F are moved in the $Y_E$ and $Y_F$ directions, respectively. While the heads are moving, the wires 21 are always tensed rearward to prevent the wires from becoming slack. Since the intermediate portion of the wires 21 is restrained by two wire guide pins 25, 26, the end portions of the wires 21 outside the restrained region are kept straight while the heads are moving.

Figure 16:
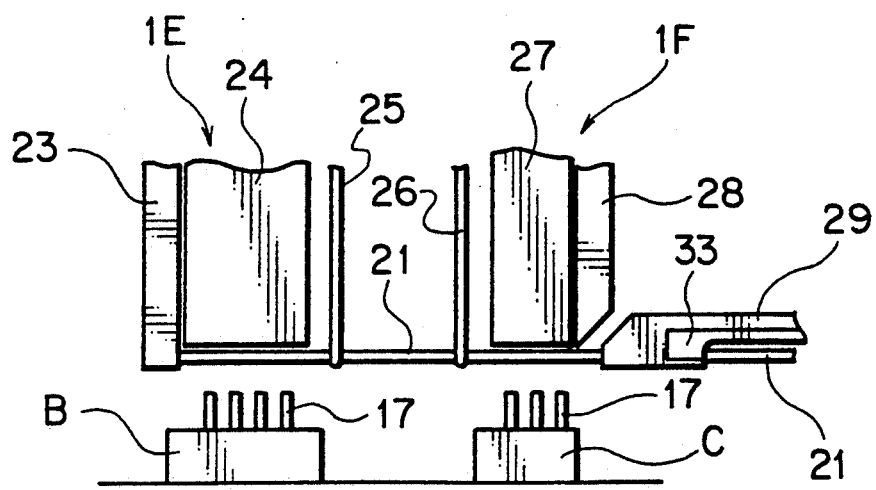
FIG. 16 is a side view showing the next step in FIG. 15.
Figure 17:
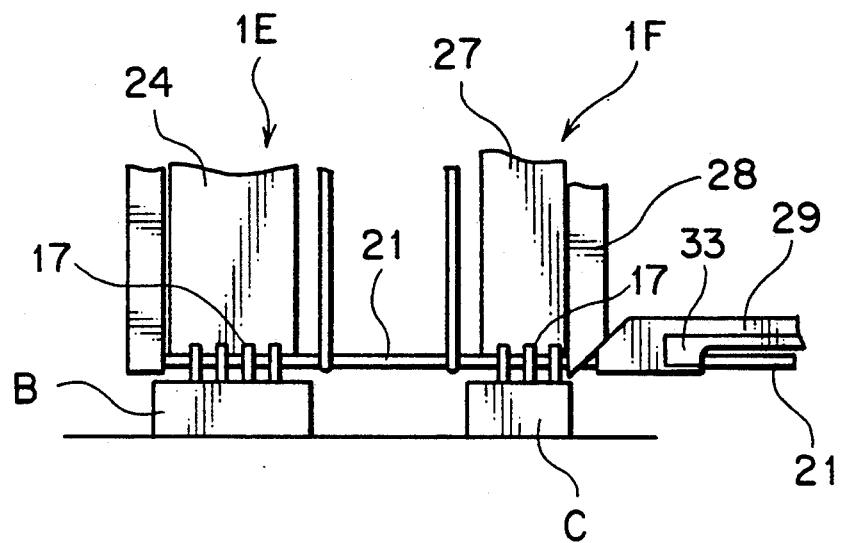
FIG. 17 is a side view showing the next step in FIG. 16.

After the front head 1E and the rear head 1F are positioned, the wire chuck 33 of the rear head 1F is closed to firmly hold the wire 21 (FIG. 16). Then, these two heads 1E, 1F as a whole are lowered to press the wire 21 onto specified pressure terminals $17_1$, $17_1'$ of the wiring board assemblies B, C. The pressure connection is accomplished by the pressing jigs 24, 27 that are lowered simultaneously with the heads to press the wire 21 into the slot 17c (see FIG. 2). After the wire is connected, the wire cutter 28 is lowered to cut it (FIG. 17).

Figure 18:
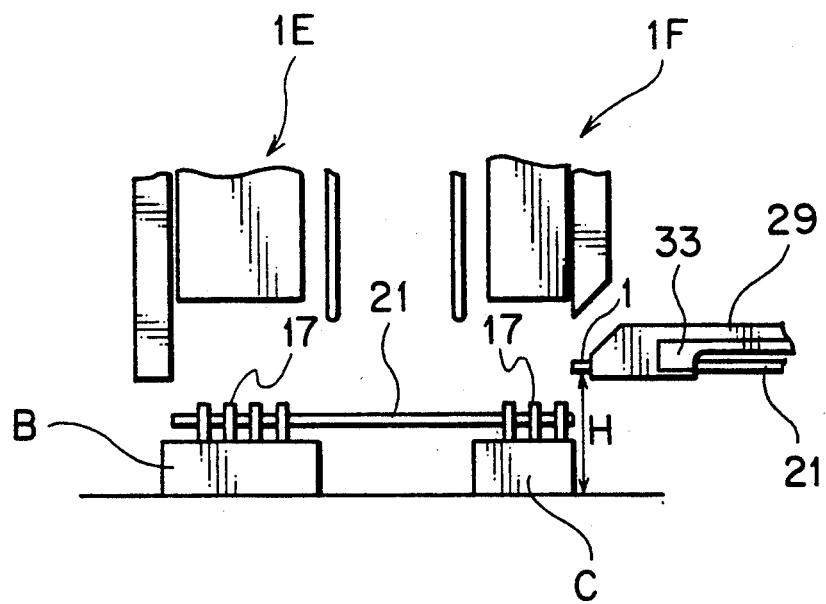
FIG. 18 is a side view showing the next step in FIG. 17.

After cutting, the front head 1E and the rear head 1F return to the original height H, in which condition the wires 21 were first laid (FIG. 18). Now, the first wire is completely wired and connected.

At step 5 (FIGS. 9, 16–18), the front heads 1E–4E and the rear heads 1F–4F, which have returned to the original height H, now move in the $Y_E$ and $Y_F$ directions, respectively. In the same way as the first row wire, the second row wire is wired and pressure-connected onto specified pressure terminals $17_2$, $17_2'$.

Steps 6 and 7 (FIGS. 10, 11 and FIGS. 16–18) perform the similar procedure the same number of times as the number of remaining wire chucks (for the front heads 3E and 4E) to connect the wire between the pressure terminals $17_3$ and $17_3'$ and between pressure terminals $17_4$ and $17_4'$.

Figure 13:
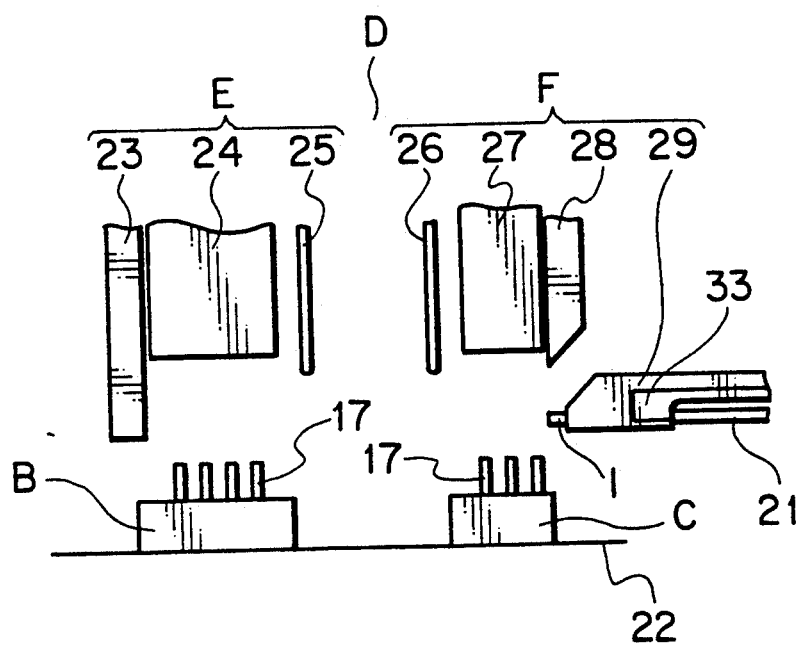
FIG. 13 is a side view showing the first step of the wiring process as performed by the apparatus of FIG. 3.
Figure 14:
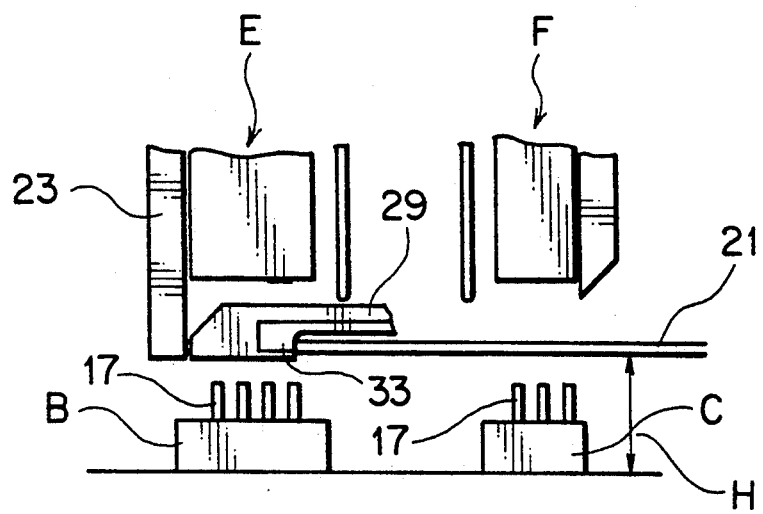
FIG. 14 is a side view showing the next step in FIG. 13.
Figure 15:
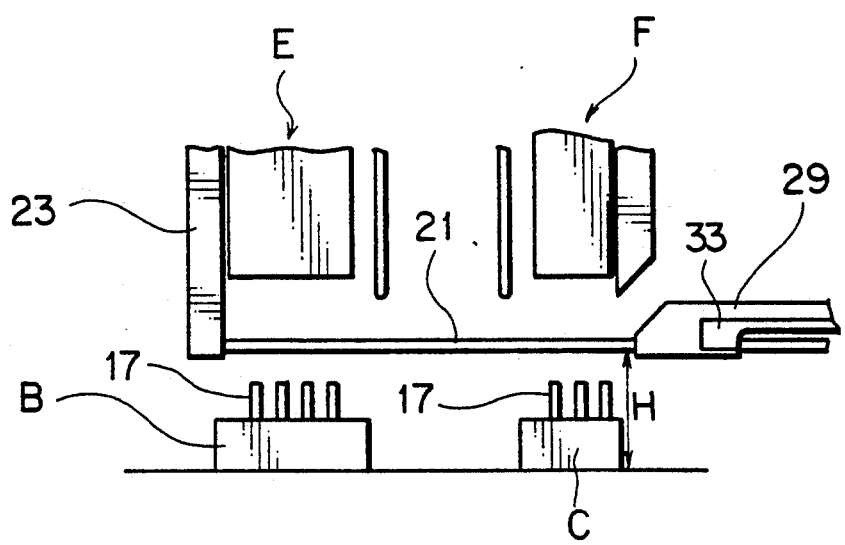
FIG. 15 is a side view showing the next step in FIG. 14.

At step 8 (FIGS. 12, 18), after the wire arrangement and pressure connection have been done the same number of times as the number of wire chucks (the number of heads or units), the front heads 1E–4E and the rear heads 1F–4F are returned to the initial state (FIGS. 5, 13).

Then, the process of step 1 through step 8 are repeated to complete the wiring between the two wiring board assemblies B and C.

As a result, the wires 21 connecting the two wiring board assemblies B, C provide an orderly arranged wiring configuration in which the end portions of the wires are straight with only the intermediate portions crossing each other. The movement of the heads and the selection of pressure terminals and wires to be used may be stored in a computer beforehand. This will eliminate erroneous wiring including wrong selection of wire size and pressure connecting position, as experienced with the conventional equipment.

Figure 19:
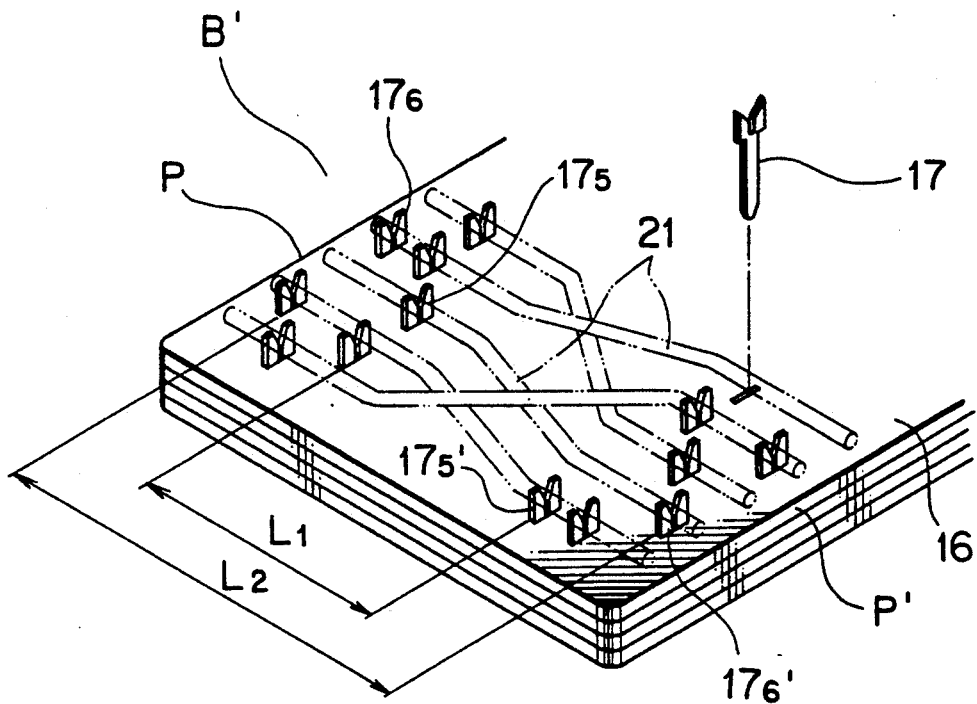
FIG. 19 is a perspective view showing another method of wiring the wiring board assembly.

In the above description, we have taken up an example where the front heads 1E–4E and the rear heads 1F–4F making up the four wire laying heads are used to accomplish cross wiring and pressure connection between the two wiring board assemblies B and C. As shown in FIG. 19, however, this invention can also be applied to a single wiring board assembly B' which has a plurality of pressure terminals 17 (or busbar's pressure connecting portions) aligned on both sides. It is also possible to change the number of parallelly arranged front and rear heads according to the size of the wiring board assembly.

In the wire laying heads shown in FIGS. 3 to 5, the front heads E (1E, 2E, ...) and the rear heads F (1F, 2F, ...) are integrally mounted on the first frame 34 and the second frame 35, respectively, so that the distances that the wire chucks 33 holding the wires move are fixed.

However, as shown in FIG. 19, the distances as indicated by $L_1$, $L_2$ between the pressure terminals such as $17_5$, $17_5'$ and $17_6$, $17_6'$ to be connected on the insulating substrate 16 vary depending on the circuit. Hence, fixing the distance of travel of the wire chuck 33 results in a longer wire laying stroke than necessary, producing unnecessary motion of the heads.

Further, as seen from FIG. 19, the above example performs wire laying in one direction only from one side P to the other side P' of the insulating substrate 16 and not in a cross direction, limiting the range of wiring. Thus, the wiring board assembly produced by the above example has a small wiring density and large rooms for improvement in terms of saving power and space.

Figure 20:
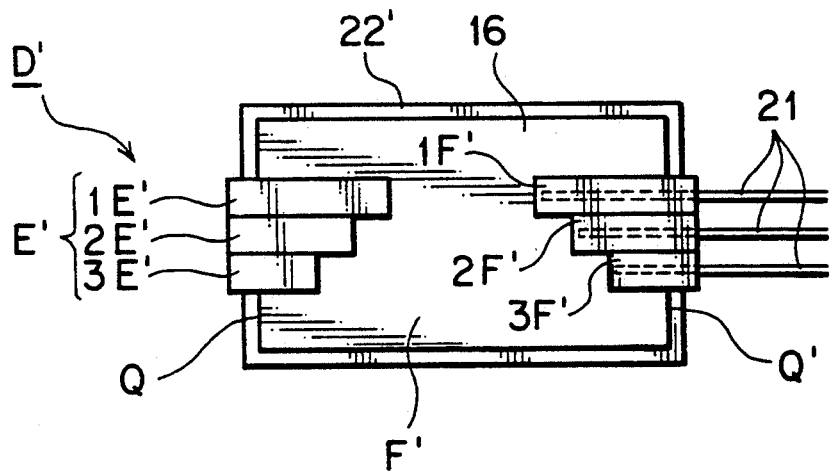
FIG. 20 is a schematic plan view showing another wiring apparatus as the second embodiment of this invention.

FIG. 20 shows another embodiment of this invention. Unlike the first embodiment in which the travel distance of the wire chuck is fixed and the wire laying direction is limited to one direction, this second embodiment makes the wire chuck travel distance variable and shortens the wire laying stroke to widen the range of wiring and increase the wiring density.

In a wiring apparatus D', a wire laying plate (or pallet) 22' is supported by a means not shown so that it can be rotated forward and backward through at least 90 degrees in the same plane as the plate surface.

A plurality of front heads E' (1E', 2E', 3E') are located at one side Q of a rectangular insulating substrate 16. On the other side Q' there are rear heads F' (1F', 2F', 3F') facing the front heads E'. The structure and the operation of these front and rear heads are the same as in the previous embodiment and detailed explanation will not be given. In this embodiment, however, the facing front and rear heads are arranged so that the distance between the facing heads progressively increases from the top row downward, as shown in the figure. Further, each pair of front and rear heads 1E', 1F' (2E', 2F'; 3E', 3F') can be moved toward and away from each other independently of other pairs.

Next, the process of wiring by the front heads 1E'–3E' and the rear heads 1F'–3F' will be described by referring to FIG. 21 through FIG. 30.

Figure 21:
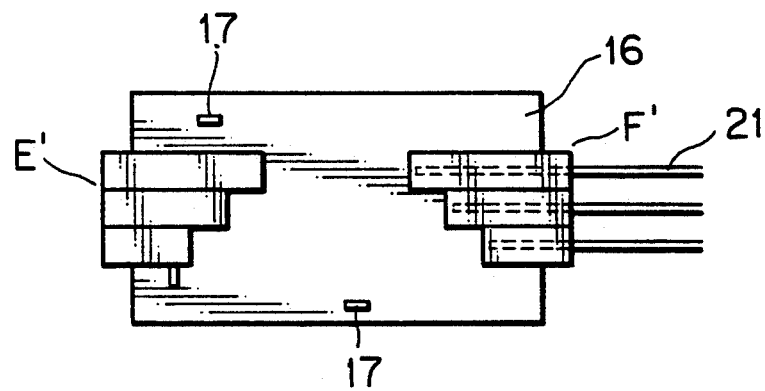
FIG. 21 is a plan view showing the first step of the wiring process as performed by the apparatus of FIG. 20.

(1) First, the insulating substrate 16 is set on the rotatable wire laying plate 22' (FIG. 21).

Figure 22:
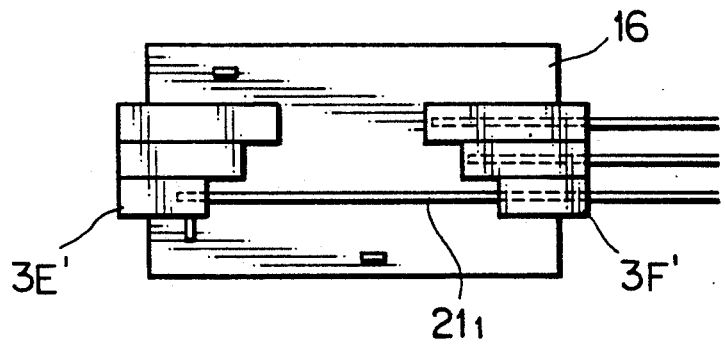
FIG. 22 is a plan view showing the next step in FIG. 21.

(2) Next, of the three pairs of front and rear heads, one pair of front head 3E' and rear head 3F' is operated to lay the wire $21_1$ between the two pressure terminals (not shown) so that the wire is parallel to the longitudinal side edges of the insulating substrate 16 (FIG. 22).

Figure 23:
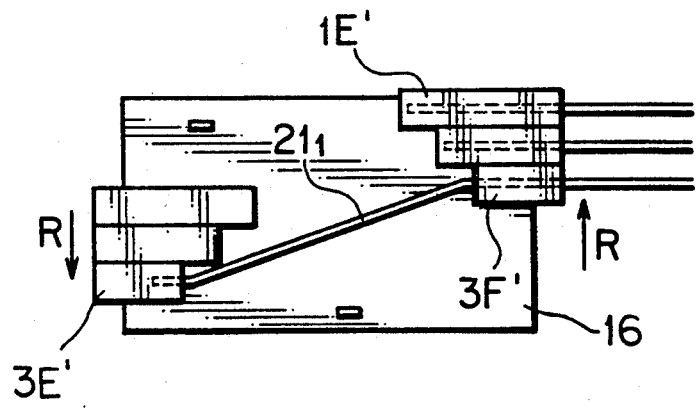
FIG. 23 is a plan view showing the next step in FIG. 22.

(3) Then, two points on an intermediate portion of the wire $21_1$ are supported by the wire guide pins 25, 26. With the both end portions kept straight, the heads 1E'–3E' as a whole are moved in the direction of arrow R perpendicular to the wire laying direction until the wire $21_1$ is positioned on the pressure terminals (FIG. 23).

(4) The pressing jigs 24, 27 are then lowered to press the wire into the slots of the pressure terminals, after which the wire is cut.

Figure 24:
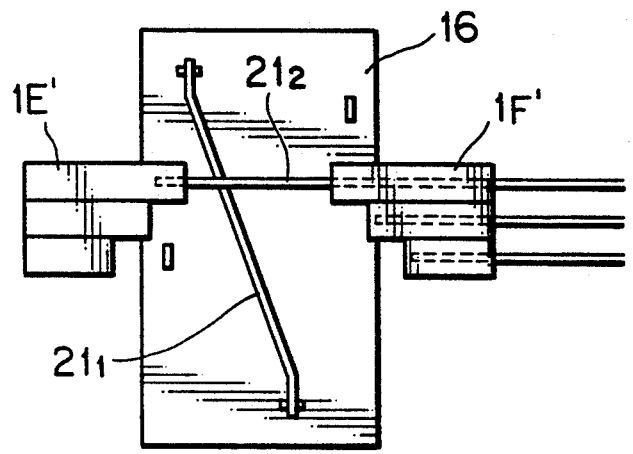
FIG. 24 is a plan view showing the next step in FIG. 23.

(5) Next, the wire laying plate 22' that holds the insulating substrate 16 is rotated through 90 degrees in the same plane as the plate surface (FIG. 24).

Figure 25:
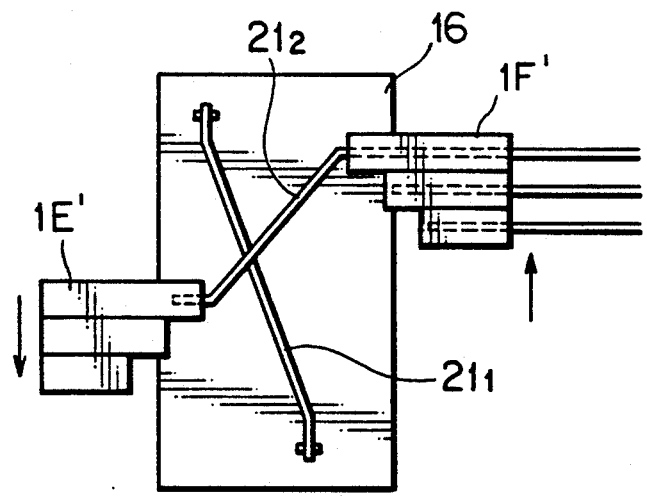
FIG. 25 is a plan view showing the next step in FIG. 24.

(6) The front head 1E' and the rear head 1F' different from the heads 3E', 3F' just used are operated to lay the wire and press-connect it in the similar manner (FIG. 25).

Figure 26:
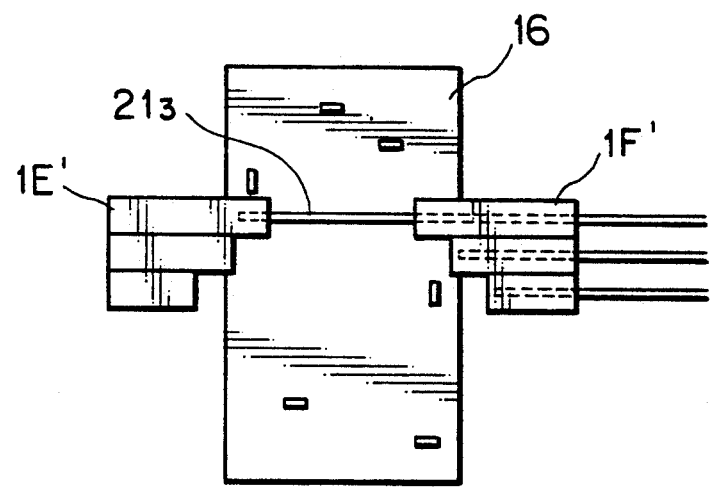
FIG. 26 is a plan view showing the next step in FIG. 25.

(7) By repeating the above steps (2) to (5), the wire laying and press-connection on one side of the insulating substrate 16 are completed. Then the lower case of the electric junction box (see FIG. 1) is set on the wired surface of the insulating substrate (8) The lower case and the half-completed wiring board assembly are overturned and secured to the wire laying plate 22' (FIG. 26).

Figure 27:
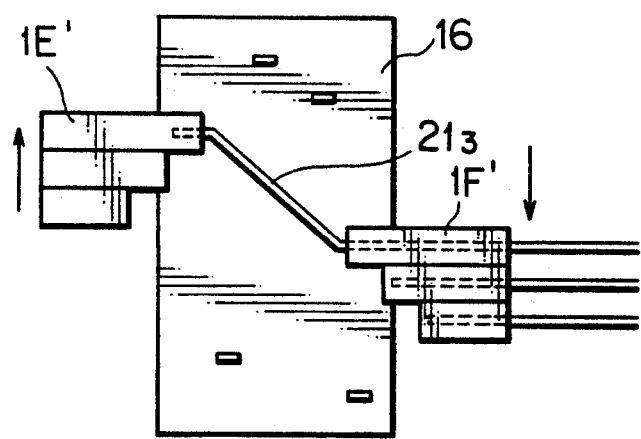
FIG. 27 is a plan view showing the next step in FIG. 26.

(9) In this condition, the wire $21_3$ is laid and press-connected on the remaining side of the substrate in one direction, as in the steps (4) and (5) (FIG. 27).

Figure 28:
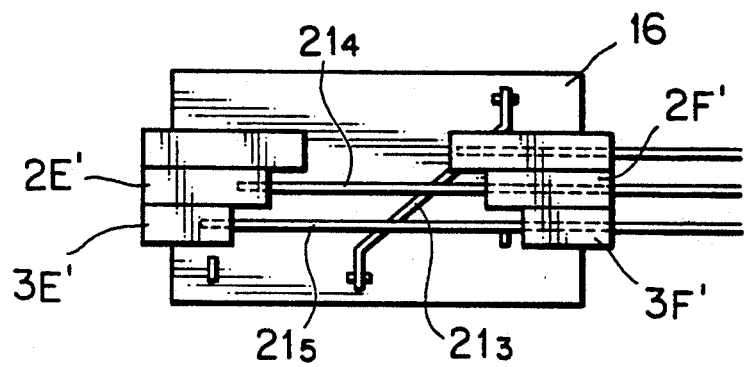
FIG. 28 is a plan view showing the next step in FIG. 27.

(10) Then, the wire laying plate 22' is again turned 90 degrees (FIG. 28).

Figure 29:
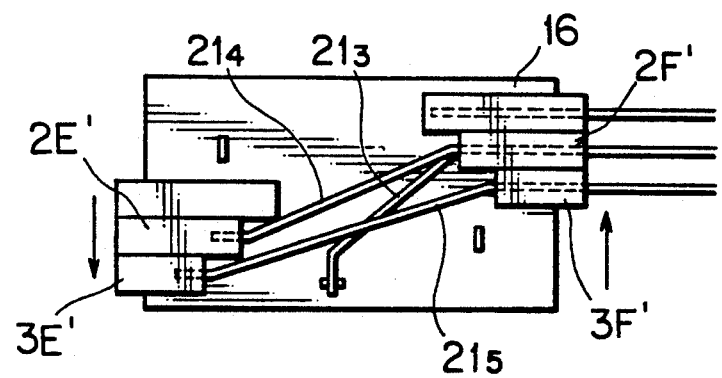
FIG. 29 is a plan view showing the next step in FIG. 28.
Figure 30:
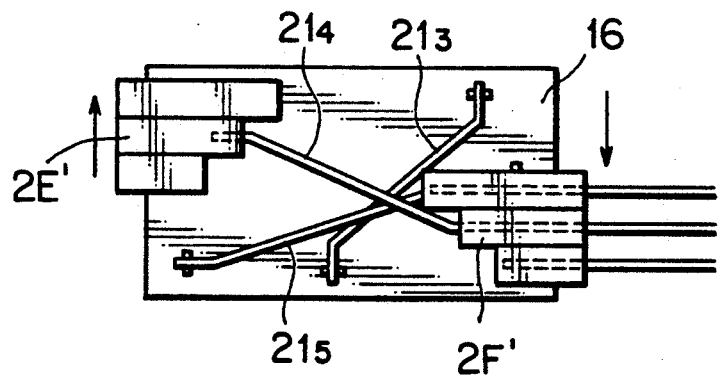
FIG. 30 is a plan view showing the next step in FIG. 29.

(11) Two pairs of heads are operated simultaneously. That is, the heads 2E', 2F' position the wire $21_4$ on the associated pressure terminals, followed by the heads 3E', 3F' positioning the wire 21₅ on the associated pressure terminals. These two wires are press-connected at the same time (FIGS. 29, 30).

(12) After the wire laying and press-connection are finished, necessary works are done, such as fitting female-female junction terminals over the male terminal portions of the pressure terminals. Then, the upper case (see FIG. 1) is placed on the wiring board assembly to complete the electric junction box.

In FIG. 21 through FIG. 30, although the wire laying and press-connecting operations on both sides of the insulating substrate 16 have been described, it is possible to perform these operations on one side only depending on the structure of the wiring board assembly. In this case, the steps (8) to (11) are omitted. While the above embodiment rotates the insulating substrate 16 90 degrees in the steps (5) and (10), the rotating angle may be determined arbitrarily according to the wire laying direction, the arrangement of pressure terminals and the circuit configuration.

Figure 31:
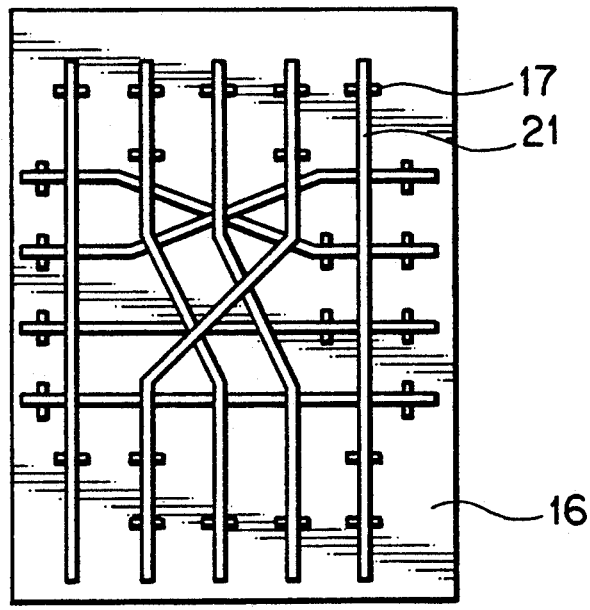
FIG. 31 is a plan view showing another wiring board assembly as wired by the apparatus of FIG. 20.

FIG. 31 is a plan view of a wiring board assembly produced by the wiring apparatus of FIG. 20, which can perform the wire laying operation in two orthogonal directions and thereby allows the pressure terminals 17 to be arranged in four directions on the insulating substrate 16. This has resulted in reduced wasted space and improved wiring density, which in turn enables reduction in the size of the wiring board assembly.

Figure 32:
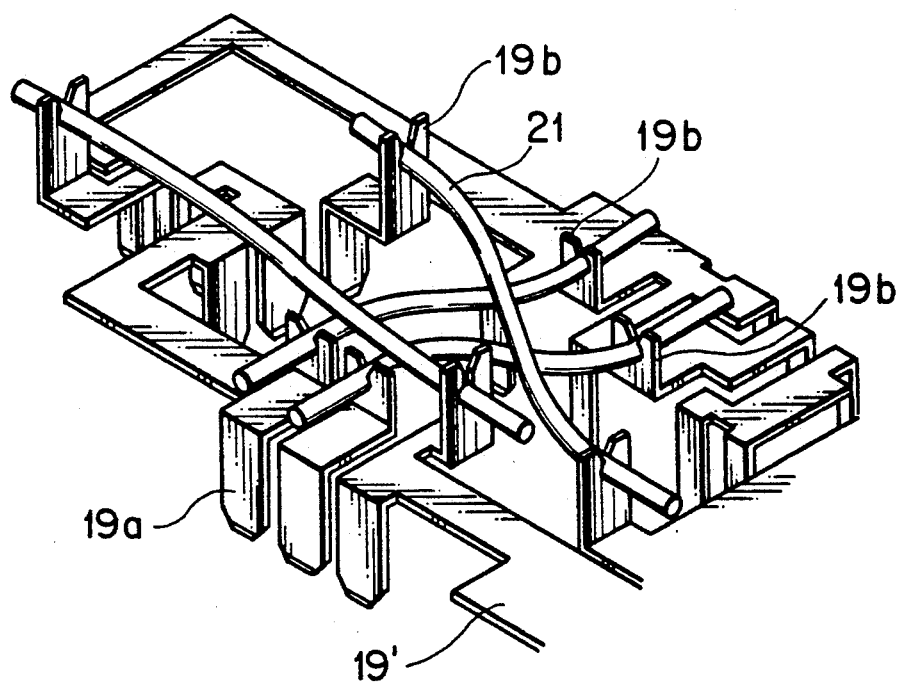
FIG. 32 is a perspective view showing a further wiring board assembly as wired by the apparatus of FIG. 20.
Figure 33:
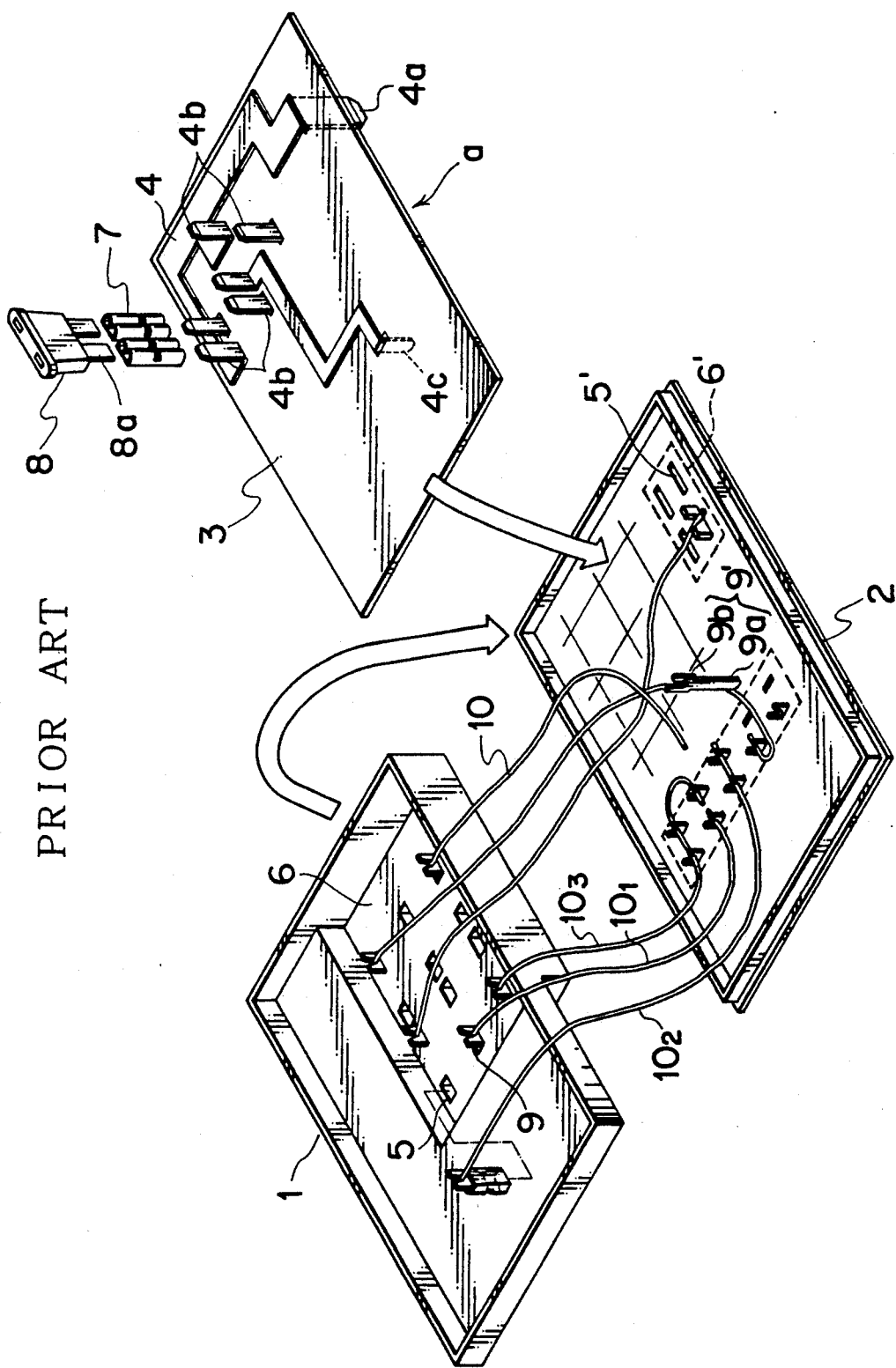
FIG. 33 is an explanatory view showing the conventional method of wiring in an electric junction box.

FIG. 32 is a perspective view of another wiring board assembly produced by the method and device of this invention. Since the wire laying can be done in two directions, busbars 19' with tabs 19a and pressure contact portions 19b can easily be connected by simply pressing the wires 21 into the slots of the pressure contact portions. This facilitates the assembly of the busbar circuits.

As described in the foregoing, with the present invention, since the erroneous wiring that has been caused by the conventional manual wiring is eliminated and a plurality of wires can be laid and press-connected in one continuous steps by operating a plurality of wire laying heads, wiring process is completed in a short time significantly improving productivity. Further, the wiring obtained with this invention is well-ordered with only the intermediate portions of wires crossing each other.

By rotating forward or backward (as by 90 degrees) in the same plane the wire laying plate that holds the insulating substrate, the wire laying can be performed in two orthogonal directions, increasing the wiring range and wiring density. This in turn leads to a reduction in the size of the wiring board assembly.

What is claimed is:

1. In a method of wiring one or two wiring board assemblies, each of which comprises a plurality of pressure terminals or busbars, each having a press-connection portion formed with a slot, and an insulating substrate that supports the pressure terminals or busbars; the method of wiring the wiring board assemblies by pressing wires into the slots of the press-connection portions on the wiring board assemblies to form a desired circuitry, comprising the steps of:

(a) laying a plurality of wires in parallel to each other between one side of the insulating substrate of the wiring board assembly and the other side or between two wiring board assemblies by operating two or more wire laying heads arranged in parallel;

(b) supporting an intermediate portion of each wire at two points at an appropriate interval to hold the wires outside the supported intermediate portions straight;

(c) moving the wire laying heads in a direction perpendicular to the wire laying direction to position the first row wire on the slots of specified press-connection portions on both sides of the wiring board assembly or on the slots of specified press-connection portions on two wiring board assemblies;

(d) pressing the positioned first row wire into the slots and cutting the wire;

(e) repeating the steps (c) and (d) to press the second to final row wires into the slots of specified press-connection portions on both sides of one wiring board assembly or into slots of specified press-connection portions on two wiring board assemblies and cutting the wires; and (f) repeating the steps (a) to (e) for the remaining press-connection portions on the wiring board assemblies.

2. In a method of wiring one or two wiring board assemblies, each of which comprises a plurality of pressure terminals or busbars, each having a press-connection portion formed with a slot, and an insulating substrate that supports the pressure terminals or busbars; the method of wiring the wiring board assemblies by pressing wires into the slots of the press-connection portions on the wiring board assemblies to form a desired circuitry, comprising the steps of:

(a') laying a plurality of wires in parallel to each other between one side of the insulating substrate of the wiring board assembly and the other side by operating two or more wire laying heads arranged in parallel;

(b') supporting an intermediate portion of each wire at two points at an appropriate interval to hold the wires outside the supported intermediate portions straight;

(c') moving the wire laying heads in a direction perpendicular to the wire laying direction to position the first row wire on the slots of specified press-connection portions on both sides of the wiring board assembly;

(d') pressing the positioned first row wire into the slots and cutting the wire;

(e') repeating the steps (c) and (d) to press the second to final row wires into the slots of specified press-connection portions on both sides of one wiring board assembly and cutting the wires;

(f') rotating the insulating substrate in the same plane of the substrate and repeating the steps (a') to (e') to perform wire laying and press-connection work in a direction crossing the already laid wires; and (g) repeating the steps (a') to (e') and step (f') selectively for the remaining press-connection portions on the wiring board assembly.

3. A wiring apparatus for wiring board assemblies comprising:

a wire laying plate on which the wiring board assemblies are mouted; and a plurality of wire laying heads arranged in parallel with each other on the wire laying plate, each wire laying head comprising a pair of front and rear heads that move vertically and parallelly with respect to the wire laying plate;

the front head including, from the front toward the rear, a wire chuck that can be opened and closed, a pressing jig and wire guide pins;

the rear head including, from the front toward the rear, wire guide pins, a pressing jig and a wire cutter, the rear head further including:

a wire holding rod located below the members of the rear head, the wire holding rod moving toward or away from the wire chuck of the front head, the wire holding rod having a wire insertion hole and a wire chuck.

4. A wiring apparatus for wiring board assemblies comprising:

a wire laying plate on which the wiring board assemblies are mounted;

a means to rotate the wire laying plate in the same plane as the plate surface; and a plurality of wire laying heads arranged in parallel with each other on the wire laying plate, each wire laying head comprising a pair of front and rear heads that move vertically and parallelly with respect to the wire laying plate;

the front head including, from the front toward the rear, a wire chuck that can be opened and closed, a pressing jig and wire guide pins;

the rear head including, from the front toward the rear, wire guide pins, a pressing jig and a wire cutter, the rear head further including:

a wire holding rod located below the members of the rear head, the wire holding rod moving toward or away from the wire chuck of the front head, the wire holding rod having a wire insertion hole and a wire chuck.

* * * * *